United States Patent
Igel et al.

(10) Patent No.: US 6,964,927 B2
(45) Date of Patent: Nov. 15, 2005

(54) METHOD AND PRODUCTION OF A SENSOR

(75) Inventors: Günter Igel, Teningen (DE); Markus Rogalla, Bad Krozingen (DE)

(73) Assignee: Micronas GmbH, Freiburg (DE)

( * ) Notice: Subject to any disclaimer, the term of this patent is extended or adjusted under 35 U.S.C. 154(b) by 299 days.

(21) Appl. No.: 10/149,560

(22) PCT Filed: Dec. 7, 2001

(86) PCT No.: PCT/EP00/12338

§ 371 (c)(1),
(2), (4) Date: Jan. 13, 2003

(87) PCT Pub. No.: WO01/42766

PCT Pub. Date: Jun. 14, 2001

(65) Prior Publication Data

US 2003/0148610 A1 Aug. 7, 2003

(30) Foreign Application Priority Data

Dec. 9, 1999 (DE) .......................... 199 59 345

(51) Int. Cl.⁷ ............................. H01L 21/302
(52) U.S. Cl. ..................... 438/706; 438/106
(58) Field of Search ................ 438/706, 725, 438/745, 106, 118, 124, 125, 126

(56) References Cited

U.S. PATENT DOCUMENTS

| | | | | |
|---|---|---|---|---|
| 4,677,526 A | * | 6/1987 | Muehling | 361/718 |
| 4,822,552 A | * | 4/1989 | Ahmed et al. | 376/257 |
| 5,859,387 A | * | 1/1999 | Gagnon | 174/52.2 |
| 5,897,338 A | | 4/1999 | Kaldenberg | 438/116 |
| 5,939,777 A | * | 8/1999 | Zuniga | 257/676 |
| 6,208,020 B1 | * | 3/2001 | Minamio et al. | 257/684 |
| 2002/0121680 A1 | * | 9/2002 | Ahn et al. | 257/666 |

FOREIGN PATENT DOCUMENTS

| | | |
|---|---|---|
| DE | 39 20 481 | 6/1989 |
| DE | 199 59 345 | 9/1999 |
| EP | 0398587 | 5/1990 |
| JP | 58021358 | 2/1983 |

* cited by examiner

Primary Examiner—Kin-Chan Chen
(74) Attorney, Agent, or Firm—O'Shea, Getz & Kosakowski, P.C.

(57) ABSTRACT

The invention relates to a method for producing a sensor (1), wherein a carrier chip (2) is produced. Said chip is provided with a sensor structure (3) comprising an active sensor surface (4). A material (9) capable of flowing is applied onto carrier chips (2) in such a way that the sensor structure (3) has a thinner layer thickness on said active sensor surface (4) than on the area of the carrier chip (2) which borders on the active sensor surface (4). The material (9) which is capable of flowing is hardened thereafter. The hardened material (9) is subsequently removed by chemical means from the surface which faces said carrier chip (2) until the active sensor surface of the sensor structure is layed bare.

18 Claims, 2 Drawing Sheets

METHOD AND PRODUCTION OF A SENSOR

BACKGROUND OF THE INVENTION

The present invention relates to the field of semiconductor sensors, and in particular to a semiconductor sensor device that includes a carrier chip comprising a sensor structure with an active sensor surface, wherein a flowable material is applied to and bounds the active sensor surface region of the carrier chip, and the flowable material is then solidified.

As known, for manufacturing a semiconductor sensor device, a block is first placed on the active sensor surface before flowable material is applied to the sensor chip. The outer contour of the block is matched to the outer contour of the sensor surface, so that, when the block is in its operational position, it covers only the sensor surface, while the regions surrounding the sensor surface are not covered by the block. The form of the surface structure of the block area that contacts the active sensor surface is matched to that of the active sensor surface, so the block seated on the sensor surface seals it against the flowable material. This material is then applied to the surface of the sensor chip in the area surrounding the block, and is then solidified. For example, the flowable material can be a plastic compound that cures or rigidifies after being applied to the sensor chip. The active sensor surface is then freely accessible for contact with a medium being investigated, while the surface regions laterally surrounding the active sensor surface are sealed by the plastic compound.

However, this method has a disadvantage that the block must be positioned on the sensor surface very precisely, to prevent the flowable material from penetrating between the block and the sensor surface. That is, the block must be precisely positioned to prevent the sensor surface from being covered with the flowable material. A further disadvantage is that the carrier chip is damaged when the block is placed on the sensor surface, and thus the device is rendered useless or at least defective. Another disadvantage of this method is that the production of the block and especially of the surface structure of that component which is complementary to the surface structure of the sensor surface when the block is in its operating position is still comparatively expensive. Finally, this known method is also unsuited for automation, and thus the economical mass production of sensors.

Therefore, there is a need for a technique of providing a protective covering over the sensor surface, the application of which does not damage the sensor.

SUMMARY OF THE INVENTION

Briefly, according to an aspect of the invention, a method of enclosing a semiconductor die operably attached to a lead frame, includes placing the die operably positioned on the lead frame into an injection molding tool and injection molding a flowable material into the tool to cover a top surface of the semiconductor die. The flowable material covering an active sensor surface has a thickness of flowable material that is less thick than the flowable material covering regions adjacent to the active sensor surface, to provide a non-uniformly coated die assembly. The non-uniformly coated die assembly is removed from the injection molding tool, and hardened flowable material is etched away until the active sensor surface is exposed, to provide an etched coated die assembly. The etched coated die assembly is again placed into the injection molding tool and a flowable additive material is injected into the tool to cover the exposed active sensor surface.

The flowable material is applied less thick on the active sensor surface of the sensor structure than on that region of the carrier chip that surrounds the active sensor surface. After the flowable material has solidified, it is chemically ablated over its entire surface that faces away from the carrier chip until the active sensor surface of the sensor structure is exposed.

The flowable material is applied to the region of the carrier chip that surrounds the sensor surface, and also on the sensor surface itself, although the sensor surface actually should ideally be kept free of the flowable material. In the region of the active sensor surface, the flowable material is applied less thick than in the laterally adjoining regions. After the flowable material has solidified, it is brought in contact with a medium that makes a chemical bond with the solidified material, such that the solidified material is ablated. This contact is made both in the region of the active sensor surface and in the laterally adjoining regions of the flowable material, at that surface which faces away from the carrier chip. The chemical ablation process is stopped when the solidified material in the region of the active sensor surface has been completely ablated and thus the sensor surface situated beneath this has been exposed. Since the flowable material has been applied thicker in the regions that laterally adjoin the sensor surface than in the region of the sensor surface itself, the regions laterally adjoining the sensor surface continue to be covered by the solidified flowable material after the sensor surface has been exposed. The chemical medium for ablating the solidified material is chosen so that it does not chemically attack the material that constitutes at least that part of the sensor structure which bears the sensor surface. The inventive method thus makes it possible, in simple fashion, to apply, on the sensor structure, a lateral boundary to the sensor surface, such that the sensor surface remains free of this boundary. Damage to the sensor structure is reliably avoided. The flowable material can solidify, in well-known fashion, by curing, solidifying, and/or the vaporization of a solvent contained in the flowable material.

The flowable material is ablated by etching after it has solidified, for example by plasma etching. The method can then be especially well integrated into a semiconductor production process, wherein the carrier chip and/or the sensor structure situated thereon include a semiconductor material.

The flowable material can be spray-applied to the carrier chip in an injection molding tool. The injection molding tool may have a block-like protrusion, which, in its operational position, faces and covers the active sensor surface, so that its boundary is flush with that of the active sensor surface. The carrier chip that bears the sensor structure can then very simply be encapsulated with the flowable material designed as a transfer molding. A transfer molding such as, for example a thermoplastic, which is used to encapsulate conventional electronic components can be used here. This method is especially suited for the industrial mass production of large numbers of sensors.

In one embodiment, a flowable additive material that covers the sensor surface is applied at least to the exposed surface of the sensor structure, and is then solidified. The additive material contacts the active sensor surface, while the remaining regions of the sensor structure are kept at a distance from the additive material through the solidified material that forms the boundary of the sensor surface. In this way, it is possible to apply an additive material to the sensor structure that may come in contact only with the active sensor surface, but not with the remaining regions of the sensor structure. The additive material can be especially a material that is necessary for the sensor to function, such as for example an ion-permeable membrane or an ion-selective sensor, a transparent layer for an optical sensor, an optical filter, an optical lens, or another material that differs from the solidified material which forms the boundary.

The flowable additive material may be sprayed on the sensor in the injection molding tool. The additive material then fills the chemically ablated regions of the solidified material, which has been applied to the sensor structure or to the carrier chip as a boundary for the sensor surface. Advantageously, the same injection molding tool can be used to spray on the additive material as was used to spray on the material forming the boundary of the sensor surface. As a result, an expensive, second injection molding tool is not required.

One embodiment of the invention provides that the carrier chip is disposed on a frame when the flowable material and, where applicable, the additive material is being applied, and that openings to receive and/or pass component regions of the frame are situated in the inner cavity of the injection molding tool, and that, in the operating position, the bounding edges of the openings contact these component regions so as to create a seal. These component regions of the frame then remain free of the flowable material and, where applicable, also of the additive material. For example, they can be equipped with external electrical contacts for connecting the sensor to an electrical or electronic circuit. The connection contacts can be connected to the sensor structure through bond wires which contact, on the one hand, the frame and, on the other hand, the carrier chip and/or the sensor structure.

The flowable material may be a photosensitive material. The material is then ablated by regions, by a masking and development process. The material is ablated such that the material which remains on the active sensor surface of the sensor structure forms a thinner layer than it does in that region of the carrier chip which surrounds the active sensor surface. The material is chemically ablated over its entire surface, until the active sensor surface of the sensor structure has been exposed.

After the flowable, photosensitive material has been applied to the carrier chip, it is conditioned if necessary, for example by heat. During the subsequent masking process, the photosensitive material is exposed by regions, for example by projecting optical radiation through a photo mask onto the photosensitive material. When a photopositive material is used, the photosensitive material situated on the active sensor surface is exposed, while the remaining photosensitive material remains unexposed. Therefore, when a photonegative material is used, the photosensitive material situated on that surface region of the carrier chip that bounds the active sensor surface is exposed, while the photosensitive material situated on the active sensor surface remains unexposed. In the following development process, the material situated on the active sensor surface is then ablated more strongly upon contact with the developer than the remaining material, which is essentially resistant to the developer. The exposure and development process can be guided such that the material situated on the active sensor surface after development is only a very thin layer. This practically obviates the risk that, during the subsequent chemical ablation of the remaining material over the entire area, undercuts or under-etchings will form in the material regions that adjoin the edge of the active sensor surface. This is especially advantageous if the remaining material is ablated by isotropic etching.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
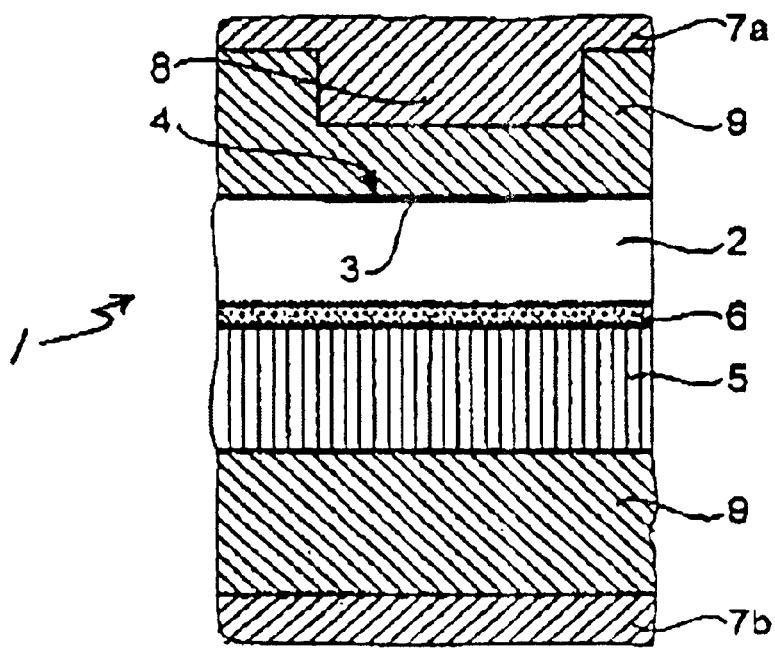
FIG. 1 shows a partial cross section through an injection molding tool, in which a semiconductor chip, which has an active sensor surface and which is situated on a frame is encapsulated by a flowable material through injection molding.

FIG. 1 shows a partial cross section through an injection molding tool, in which a semiconductor sensor chip 1 that includes an active sensor surface is situated on a frame and is encapsulated. The sensor 1 includes a carrier chip 2, which is designed as a semiconductor chip, and which has a sensor structure 3 with an active sensor surface 4. The carrier chip 2 is disposed on a frame 5, together with other carrier chips. The carrier chip 2 adheres to the frame 5 through an adhesive layer 6, which is located between the carrier chip 2 and the frame 5. The carrier chip 2, situated on the frame 5, is placed into the inner cavity of an injection molding tool, which has two molding parts 7a, 7b, that can move relative to one another and that can be brought into an open and closed position.

The injection molding tool has openings (not shown in the drawing) which are situated in the separation plane of the mold parts 7a, 7b. When the mold parts 7a, 7b are in the closed position, these openings take up component regions of the frame 5, which is inserted in the inner cavity of the injection molding tool. The shape of the openings is matched to the shape of the component regions of the frame 5 inserted in them, so that, when the mold parts 7a, 7b are in the closed position, the bounding edges of the openings always contact the component regions of the frame 5, which are inserted into the openings, in such a way as to create a seal. At the openings, the frame is interlocked with the mold parts 7a, 7b, which are in their closed position.

FIG. 1 shows that the oppositely facing, flat sides of the arrangement formed by the carrier chip 2, the frame 5, and the adhesive layer 6 always are at a distance from the inside walls of the mold parts 7a, 7b, which are situated in their closed position. Referring still to FIG. 1, the mold part 7a of the injection molding tool has a block-like protrusion 8. When the injection molding tool is in its closed position, the block-like protrusion 8 faces the active sensor surface 4 of the carrier chip 2, which is inserted into the inner cavity of the injection molding tool. The block-like protrusion 8 then covers the sensor surface 4, such that the bounding edge of the block-like protrusion 8 coincides with that of the active sensor surface 4. FIG. 1 shows that, in the region of the sensor surface 4, the carrier chip 2 has a lesser distance from the inside wall of the mold part 7a, in a direction orthogonal to the extensive plane of the carrier chip 2, than in the regions of the carrier chip 2, which laterally adjoin the sensor surface 4.

After the injection molding tool has been closed, the carrier chip 2 located within the tool is encapsulated by injection molding in a flowable material 9, such as for example a plastic. The flowable material 9 is introduced into the inner cavity of the injection molding tool through inlet ducts, which are not shown in the drawing, under pressure and possibly under the action of heat. The flowable material 9 fills the free spaces situated between the arrangement formed by the carrier chip 2, the frame 5, and the adhesive layer 6, and the walls of the mold parts 7a, 7b. FIG. 1 clearly shows that the flowable material is applied less thick on the active sensor surface 4 of the sensor structure 3 than on the regions of the carrier chip 2, which laterally bound the active sensor surface 4. After the carrier chip has been encapsulated by injection molding, the material 9 is solidified and rigidified by cooling. The encapsulated carrier chips 2, together with the frame 5, are then demolded (i.e., removed) from the injection molding tool.

Figure 2:
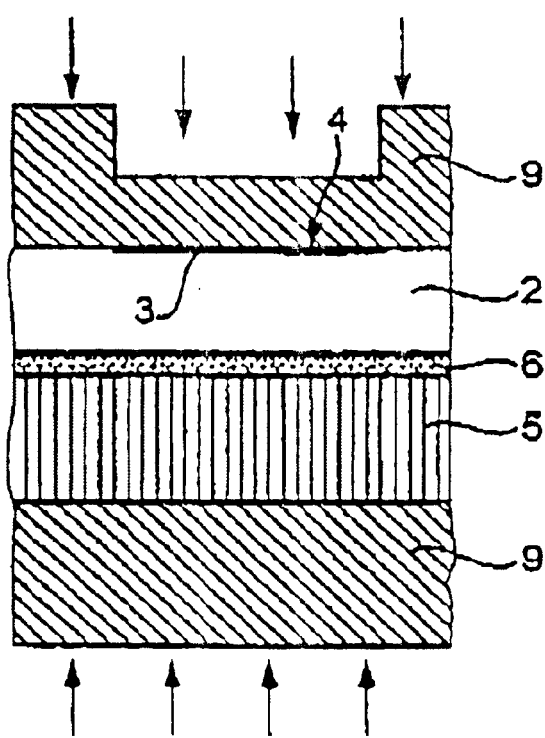
FIG. 2 shows a partial cross section of the semiconductor chip demolded from the injection molding tool, when the sprayed-on and solidified material is ablated.
Figure 3:
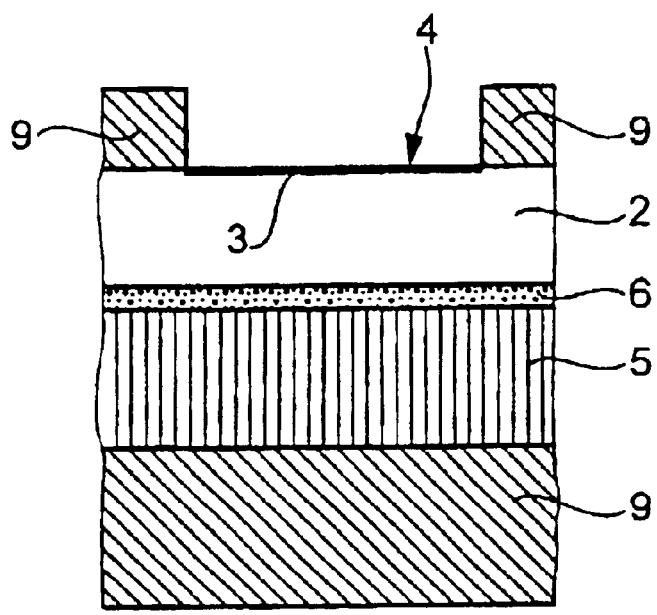
FIG. 3 shows a partial cross section through the arrangement of FIG. 2, after the active sensor surface of the semiconductor chip has been exposed.

The surface of the material 9 that faces away from the carrier chip 2 is then ablated by etching, for example by wet etching or by plasma etching. In FIG. 2, the ablation process is symbolically represented by arrows. The etching process is stopped when the material 9 has been completely ablated from the carrier chip 2 in the region of the active sensor surface 4, and the sensor surface 4 situated beneath this is exposed. The etching technique employed is chosen so that the material of the sensor structure 3 is chemically stable against the etching technique, and thus the sensor structure 3 is not altered by contact with the etching material. As FIG. 3 illustrates the regions of the carrier chip 2, which laterally adjoin the sensor surface 4, and continue to be covered by the material 9 after the sensor surface 4 has been exposed.

Figure 4:
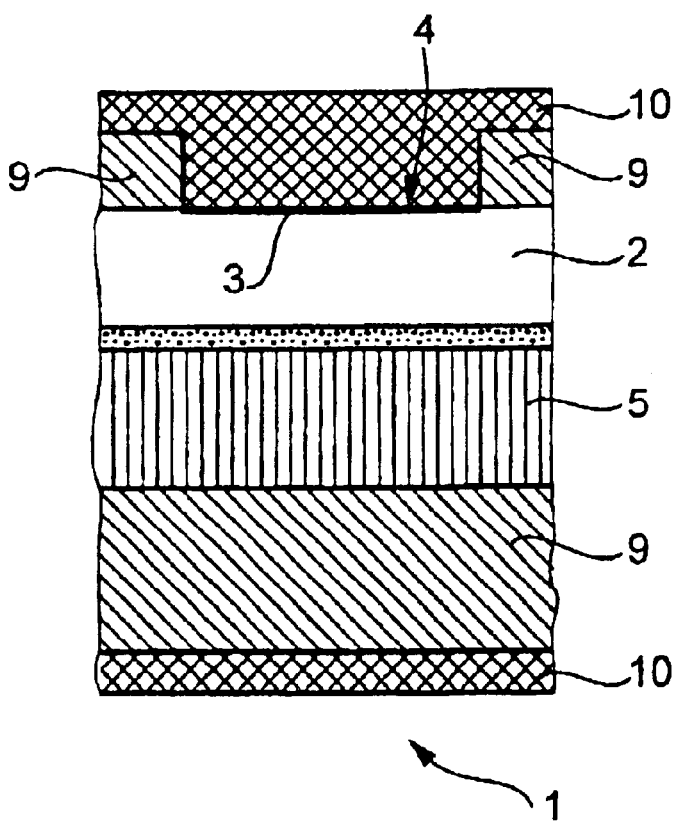
FIG. 4 shows a partial cross section through the sensor shown in FIG. 3, after it has been encapsulated with an additive material by injection molding.

After the sensor surface 4 is exposed, the frame 5 together with the carrier chips 2 adhering thereto through the adhesive layer 6, is again inserted into the injection molding tool, and the mold parts 7a, 7b are closed. The above-mentioned component regions of the frame 5 now engage the openings of the injection molding tool assigned to them, such that the frame 5 is positioned in the inside cavity of the injection molding tool, in the same way as when it is being encapsulated by the flowable material 9. At locations where the material 9 has been etched away at the encapsulation of the carrier chip 2, a free space remains between the carrier chip 2, encapsulated by the material 9, and the respectively adjoining inside wall of the mold parts 7a, 7b. A flowable additive material 10 is injected into this free space through the inlet ducts of the mold parts 7a, 7b to fill the free space. The additive material 10 then solidifies, for example by rigidifying and/or curing. In the embodiment illustrated in FIG. 4, the additive material 10 is optically transparent, and forms a window that is transparent to the visible radiation that is to be detected. The radiation to be detected can pass through this window to the light-sensitive sensor surface 4 of the sensor structure 3.

By the method for producing the sensor 1, a carrier chip 2 is thus produced, which has the sensor structure 3 with an active sensor surface 4. A flowable material 9 is applied to the carrier chips 2, in such a way that it forms a thinner layer on the active sensor surface 4 of the sensor structure 3 than on the regions of the carrier chip 2, which laterally adjoin the active sensor surface 4. The flowable material 9 is then solidified. The surface of the solidified material 9 that faces away from the carrier chip 2 is then chemically ablated, until the active sensor surface of the sensor structure is exposed.

Although the present invention has been shown and described with respect to several preferred embodiments thereof, various changes, omissions and additions to the form and detail thereof, may be made therein, without departing from the spirit and scope of the invention.

What is claimed is:

1. A method for producing a sensor, such that a carrier chip is produced, which has a sensor structure with an active sensor surface, a flowable material is applied to that surface region of the carrier chip, which bounds the active sensor surface, and this material is then solidified, wherein the flowable material is applied less thick on the active sensor surface of the sensor structure than on the region of the carrier chip, which surrounds the active sensor surface, and that, after the flowable material has solidified, it is chemically ablated over its entire surface which faces away from the carrier chip, until the active sensor surface of the sensor structure is exposed.

2. The method of claim 1, wherein after the flowable material has solidified, it is ablated by etching.

3. The method of claim 2, wherein the carrier chip is encapsulated by the flowable material in an injection molding tool, and that the injection molding tool has a block-like protrusion, which, in its operating position, faces the active sensor surface, such that its bounding edge is flush with that of the active sensor surface.

4. The method of claim 3, wherein a flowable additive material is applied at least on the exposed sensor surface of the sensor structure to cover the sensor surface, and is then solidified.

5. The method of claim 3, wherein the flowable additive material is sprayed on the sensor in the injection molding tool.

6. The method of claim 5, wherein the carrier chip is disposed on a frame when the flowable material and, where applicable, the additive material is being applied, and that openings to receive and/or pass component regions of the frame are situated in the inner cavity of the injection molding tool, and that, in the operating position, the bounding edges of the openings contact these component regions so as to create a seal.

7. The method of claim 5, wherein a photosensitive material is applied, as the flowable material, to the active sensor surface and the surrounding surface region of the carrier chip, and that the material is then ablated by regions, by a masking and development process, in such a way that the material which remains on the active sensor surface of the sensor structure forms a thinner layer than it does in the region of the carrier chip, which surrounds the active sensor surface, and that the material is then chemically ablated over its entire surface, until the active sensor surface of the sensor structure has been exposed.

8. A method of enclosing a semiconductor die attached to a lead frame, said method comprising:
  placing the die operably positioned on the lead frame into an injection molding tool;
  injection molding a flowable material into the tool to cover a top surface of the semiconductor die, wherein the flowable material covering an active sensor surface has a thickness of flowable material that is less thick than the flowable material covering regions adjacent to the active sensor surface, to provide a non-uniformly coated die assembly;
  removing the non-uniformly coated die assembly from the injection molding tool, and etching away hardened flowable material until the active sensor surface is exposed, to provide an etched coated die assembly; and placing the etched coated die assembly into the injection molding tool and injecting a flowable additive material into the tool to cover the exposed active sensor surface.

9. The method of claim 8, wherein the flowable additive material is optically transparent.

10. The method of claim 9, wherein the flowable material is a plastic material.

11. The method of claim 10, wherein said step of etching comprises plasma etching.

12. A method of enclosing a sensor having an active sensor surface located on a top surface of a semiconductor die attached to a lead frame, said method comprising:

applying a flowable material to cover a top surface of the semiconductor die using a first tool, wherein the flowable material covering the active sensor surface has a thickness of flowable material that is less thick than the flowable material covering regions adjacent to the active sensor surface, to provide a non-uniformly coated die assembly that has a relatively planar top surface of flowable material;

ablating hardened flowable material until the active sensor surface is exposed, to provide an etched coated die assembly; and applying flowable additive material to cover the exposed active sensor surface using the first tool.

13. The method of claim 12, wherein the flowable additive material is optically transparent.

14. The method of claim 12, wherein prior to said step of applying flowable material, placing the die operably positioned on the lead frame into the first tool, which is an injection molding tool.

15. The method of claim 12, wherein said step of applying flowable additive material comprises placing the etched coated die assembly into the injection molding tool, and then covering the exposed active sensor surface with the flowable additive material.

16. The method of claim 15, wherein the flowable material is a plastic material.

17. The method of claim 12, wherein said step of ablating comprises chemically etching away the hardened material.

18. The method of claim 17, wherein said step of chemically etching comprises plasma etching.

* * * * *